United States Patent
Zelsacher et al.

(10) Patent No.: US 9,030,028 B2
(45) Date of Patent: May 12, 2015

(54) METHOD FOR MANUFACTURING SEMICONDUCTOR DEVICES HAVING A METALLISATION LAYER

(71) Applicant: Infineon Technologies Austria AG, Villach (AT)

(72) Inventors: Rudolf Zelsacher, Klagenfurt (AT); Paul Ganitzer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/295,791

(22) Filed: Jun. 4, 2014

(65) Prior Publication Data

US 2014/0284819 A1   Sep. 25, 2014

Related U.S. Application Data

(62) Division of application No. 12/837,189, filed on Jul. 15, 2010.

(51) Int. Cl.
*H01L 23/48* (2006.01)
*H01L 23/52* (2006.01)
(Continued)

(52) U.S. Cl.
CPC .......... *H01L 23/562* (2013.01); *H01L 21/6835* (2013.01); *H01L 21/78* (2013.01); *H01L 23/3107* (2013.01); *H01L 23/492* (2013.01); *H01L 23/49811* (2013.01); *H01L 29/0657* (2013.01); *H01L 2221/68327* (2013.01); *H01L 2221/6834* (2013.01); *H01L 2221/6835* (2013.01); *H01L 2224/48091* (2013.01); *H01L 2224/48227* (2013.01); *H01L 2224/4823* (2013.01); *H01L 2924/01014* (2013.01); *H01L 2924/01078* (2013.01); *H01L 24/48* (2013.01); *H01L 2924/00014* (2013.01);
(Continued)

(58) Field of Classification Search
CPC ..................... H01L 23/4924; H01L 23/49517; H01L 24/42
See application file for complete search history.

(56) References Cited

U.S. PATENT DOCUMENTS

| 4,235,645 A | 11/1980 | Johnson |
| 5,259,737 A | 11/1993 | Kamisuki et al. |

(Continued)

FOREIGN PATENT DOCUMENTS

| DE | 10339487 | 3/2005 |
| DE | 10 2006 054 311 | 5/2008 |

(Continued)

OTHER PUBLICATIONS

Notice of Allowance mailed Feb. 14, 2014 in U.S. Appl. No. 12/837,189.

(Continued)

*Primary Examiner* — Daniel Luke
(74) *Attorney, Agent, or Firm* — Dicke, Billig & Czaja, PLLC

(57) ABSTRACT

A method for manufacturing semiconductor devices is disclosed. In one embodiment a semiconductor substrate having a first surface, a second surface opposite to the first surface and a plurality of semiconductor components is provided. The semiconductor substrate has a device thickness. At least one metallization layer is formed on the second surface of the semiconductor substrate. The metallization layer has a thickness which is greater than the device thickness.

3 Claims, 15 Drawing Sheets

(51) Int. Cl.
  *H01L 29/40*  (2006.01)
  *H01L 23/00*  (2006.01)
  *H01L 21/683* (2006.01)
  *H01L 21/78*  (2006.01)
  *H01L 23/492* (2006.01)
  *H01L 23/498* (2006.01)
  *H01L 29/06*  (2006.01)
  *H01L 23/31*  (2006.01)

(52) U.S. Cl.
  CPC .............. *H01L 2924/01068* (2013.01); *H01L 2924/13055* (2013.01); *H01L 2924/13062* (2013.01); *H01L 2924/14* (2013.01); *H01L 2224/03002* (2013.01); H01L 24/03 (2013.01); *H01L 24/05* (2013.01); H01L 24/06 (2013.01); *H01L 24/32* (2013.01); *H01L 24/73* (2013.01); *H01L 2224/0345* (2013.01); *H01L 2224/03462* (2013.01); *H01L 2224/0362* (2013.01); *H01L 2224/04042* (2013.01); *H01L 2224/05073* (2013.01); *H01L 2224/05082* (2013.01); *H01L 2224/05214* (2013.01); *H01L 2224/05139* (2013.01); *H01L 2224/05147* (2013.01); *H01L 2224/05155* (2013.01); *H01L 2224/05166* (2013.01); *H01L 2224/05171* (2013.01); *H01L 2224/05611* (2013.01); *H01L 2224/05639* (2013.01); *H01L 2224/05647* (2013.01); *H01L 2224/0603* (2013.01); *H01L 2224/06181* (2013.01); *H01L 2224/291* (2013.01); *H01L 2224/32225* (2013.01); *H01L 2224/73265* (2013.01); *H01L 2224/8382* (2013.01); *H01L 2224/94* (2013.01); *H01L 2924/15153* (2013.01); *H01L 2224/03622* (2013.01); *H01L 2224/03009* (2013.01); *H01L 2224/3223* (2013.01)

(56) References Cited

U.S. PATENT DOCUMENTS

| | | | |
|---|---|---|---|
| 5,798,557 A | 8/1998 | Salatino et al. | |
| 5,825,092 A | 10/1998 | Delgado et al. | |
| 6,146,917 A | 11/2000 | Zhang et al. | |
| 6,391,742 B2 | 5/2002 | Kawai | |
| 6,630,725 B1 | 10/2003 | Kuo et al. | |
| 6,835,588 B2 | 12/2004 | An et al. | |
| 6,841,839 B2 | 1/2005 | Sridhar et al. | |
| 7,098,117 B2 | 8/2006 | Najafi et al. | |
| 7,138,335 B2 | 11/2006 | Toyoda et al. | |
| 7,204,737 B2 | 4/2007 | Ding et al. | |
| 7,208,337 B2 | 4/2007 | Eisert et al. | |
| 7,393,758 B2 | 7/2008 | Sridhar et al. | |
| 7,408,257 B2 | 8/2008 | Jung et al. | |
| 7,419,840 B2 | 9/2008 | Omori | |
| 7,605,057 B2 | 10/2009 | Shimoyama et al. | |
| 7,622,324 B2 | 11/2009 | Enquist et al. | |
| 7,867,807 B2 | 1/2011 | Kishita et al. | |
| 8,012,850 B2 | 9/2011 | Kojima et al. | |
| 2002/0019079 A1 | 2/2002 | Kawai | |
| 2002/0175331 A1 | 11/2002 | Isokawa et al. | |
| 2004/0009649 A1 | 1/2004 | Kub et al. | |
| 2005/0009315 A1 | 1/2005 | Kim et al. | |
| 2006/0160273 A1 | 7/2006 | Chen | |
| 2008/0003720 A1 | 1/2008 | Lu et al. | |
| 2008/0032488 A1 | 2/2008 | Chu et al. | |
| 2008/0050906 A1* | 2/2008 | Lee et al. | 438/614 |
| 2008/0217743 A1 | 9/2008 | Kojima et al. | |
| 2009/0181520 A1 | 7/2009 | Li et al. | |
| 2010/0117176 A1 | 5/2010 | Uekawa | |
| 2010/0201221 A1 | 8/2010 | Inoue et al. | |
| 2010/0207697 A1 | 8/2010 | Sayama | |
| 2011/0018112 A1 | 1/2011 | Ogura et al. | |
| 2012/0012994 A1 | 1/2012 | Von Koblinski | |

FOREIGN PATENT DOCUMENTS

| | | |
|---|---|---|
| DE | 10 2011 051 823 | 4/2012 |
| JP | 10-98121 | 4/1998 |
| JP | 2007-158212 | 6/2007 |
| JP | 2008-218832 | 9/2008 |
| JP | 2009-515338 | 4/2009 |
| WO | 2004/090975 | 10/2004 |
| WO | 2009-123308 | 10/2009 |

OTHER PUBLICATIONS

Office Action mailed Sep. 16, 2013 in U.S. Appl. No. 13/966,492.
Office Action mailed Aug. 6, 2013 in U.S. Appl. No. 12/837,189.
Office Action mailed Sep. 6, 2012 in U.S. Appl. No. 12/837,189.
Final Office Action mailed Mar. 13, 2013 in U.S. Appl. No. 12/837,189.
Notice of Allowance mailed Feb. 22, 2012 in U.S. Appl. No. 12/837,155.
Notice of Allowance mailed May 28, 2013 in U.S. Appl. No. 13/495,603.
Office Action mailed Jul. 15, 2014 in U.S. Appl. No. 12/837,189.

* cited by examiner

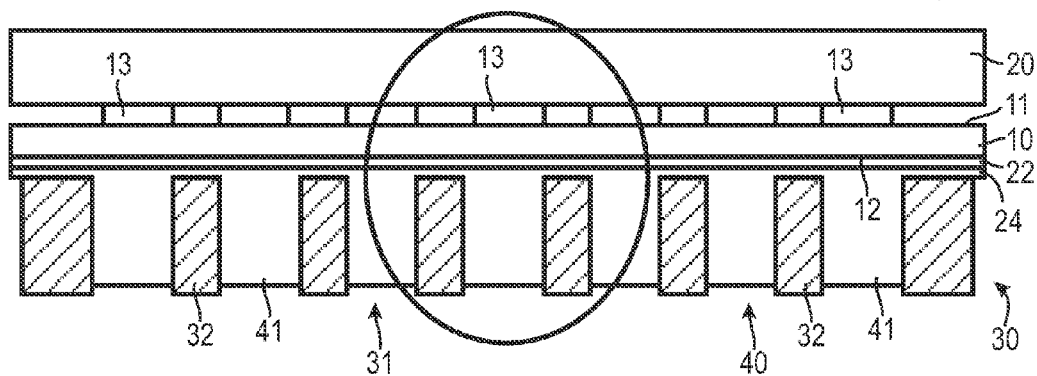
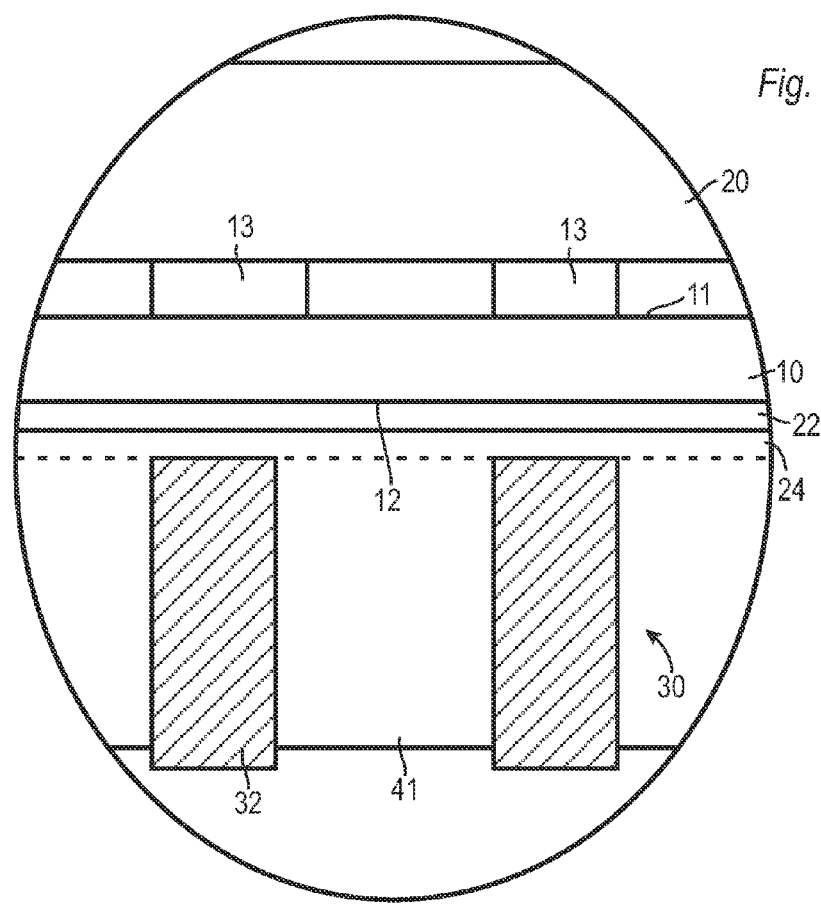

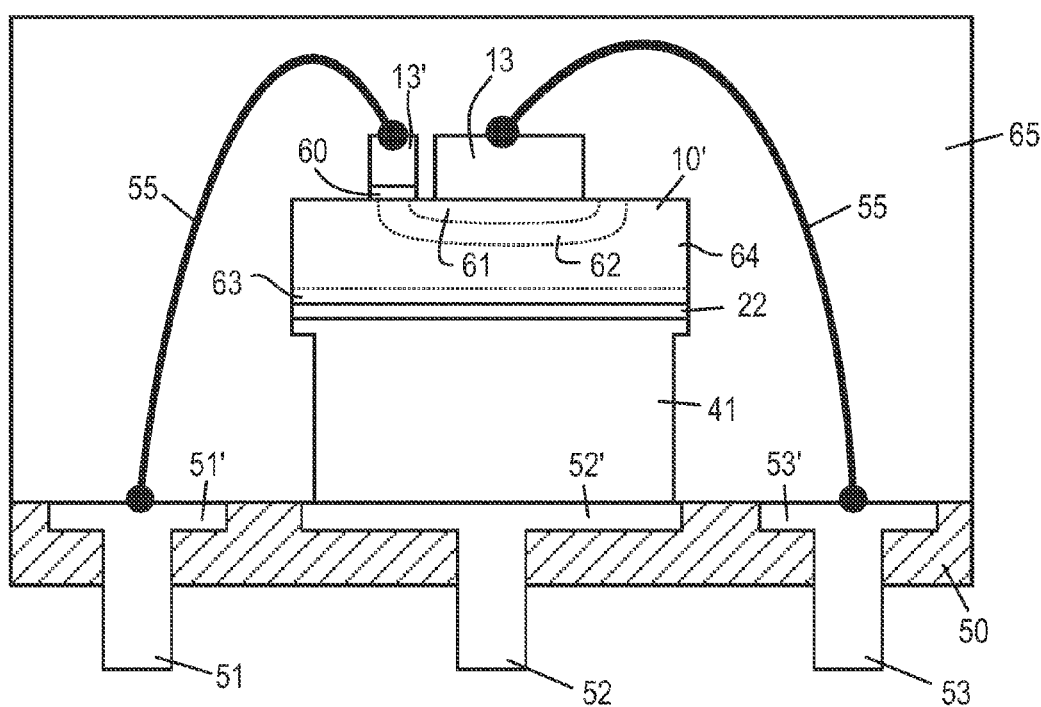

METHOD FOR MANUFACTURING SEMICONDUCTOR DEVICES HAVING A METALLISATION LAYER

CROSS-REFERENCE TO RELATED APPLICATIONS

This Utility Patent Application is a divisional application of U.S. application Ser. No. 12/837,189, filed Jul. 15, 2010, which is incorporated herein by reference.

This description refers to embodiments of methods for manufacturing semiconductor devices having a thick metallisation. Embodiments relate to semiconductor devices, and in one embodiment to power semiconductor devices.

BACKGROUND

In order to improve the device characteristics of semiconductor devices attempts have been made to reduce the final thickness of the semiconductor material, particularly for power semiconductor devices. It is desired that the semiconductor chip of such devices has a thickness which is just sufficient for accommodating the device or circuit.

The manufacturing and handling of thin semiconductor chips and wafers is complicated since the brittle semiconductor material, once thinned, is prone to breaking. To improve the mechanical stability of thinned semiconductor material during manufacturing, carrier systems have been developed. When finally detaching thin semiconductor chips from such carrier systems, the thin chips may break.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1K illustrate processes of a method for manufacturing semiconductor devices according to one embodiment.

FIG. 2 illustrates a final structure of a semiconductor device according to an embodiment.

DETAILED DESCRIPTION

Figure 1A:
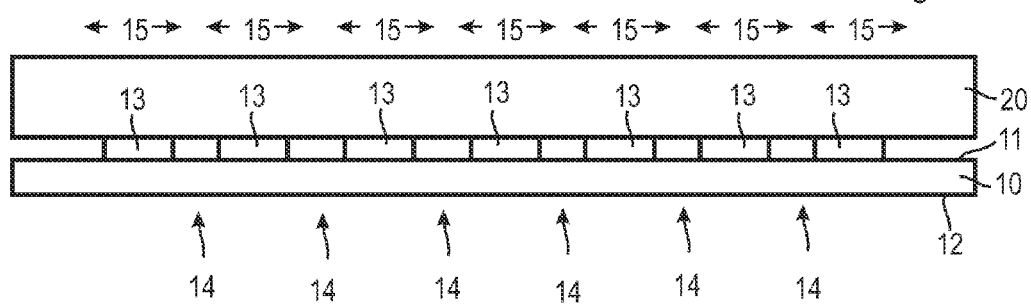

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The term "semiconductor component" as used in this specification intends to describe a semiconductor device which is at least partially processed in and on the semiconductor substrate or wafer. Partially processed means that the semiconductor device is not fully completed and that further processes such as formation of doping regions, contact regions and metallisation, and dicing are required to obtain an operable semiconductor device. A semiconductor component typically includes at least one doping region and at least one metal pad in electrical connection with this doping region. In case of power devices, a semiconductor component includes a plurality of substantially identical cells forming together a power device.

The semiconductor device is at least a two-terminal device, an example is a power-diode. The semiconductor device can also be a three-terminal device such as a power field-effect transistor (FET), insulated gate bipolar transistor (IGBT), junction field effect transistors (JFET), and thyristors to name few. The semiconductor device can also include more than three terminals. The semiconductor device can generally be any integrated product such as power devices and integrated circuits having a plurality of terminals.

Specific embodiments described herein pertain to, without being limited thereto, power semiconductor devices and particularly to devices which are controlled by field-effect.

According to an embodiment, a method for manufacturing semiconductor devices is provided. A semiconductor substrate having a first surface, a second surface opposite to the first surface and a plurality of semiconductor components is provided. The semiconductor substrate has a device thickness at least in the region of each semiconductor component. At least one metallisation layer is formed on the second surface of the semiconductor substrate. The metallisation layer has a thickness which is greater than the device thickness of the semiconductor substrate. The semiconductor substrate is diced along separation regions between adjacent semiconductor components to obtain separate semiconductor devices.

According to another embodiment, a semiconductor device is provided. The semiconductor device includes a semiconductor chip having a first surface and a second surface opposite to the first surface. The semiconductor chip has a given thickness. At least one metallisation portion is disposed on the second surface of the semiconductor chip, wherein the metallisation portion has a thickness greater than the thickness of the semiconductor chip.

According to another embodiment, a method for manufacturing a semiconductor device is provided. A semiconductor substrate having a first surface, a second surface opposite to the first surface and an initial thickness is provided. The second surface of the semiconductor substrate is machined to reduce the initial thickness of the semiconductor substrate down to a device thickness less than the initial thickness at least in selected regions. Metallisation portions are formed on the second surface of the semiconductor substrate in the selected regions, such that the metallisation portions are laterally spaced apart from each other by separation regions. The semiconductor substrate is diced along the separation regions to obtain separate semiconductor devices.

With reference to FIGS. 1A to 1K, an embodiment of a method for manufacturing semiconductor devices is described. A semiconductor substrate 10 is provided which includes a first surface 11 and a second surface 12 arranged opposite to the first surface 11. The semiconductor substrate 10 is typically a semiconductor wafer and includes a plurality of doping regions which are not illustrated in FIG. 1A. FIG. 2, which illustrates enlarged details of a finished semiconductor device, includes doping regions. The doping regions are for example formed at the first surface 11 and form, for example, anode regions of diodes. In case of a FET, the doping regions can be body regions and/or source regions.

The semiconductor substrate 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Metal pads 13 or other structures of semiconductor components can be arranged on the first surface 11. Metal pads 13 can be, for example, gate pad structures or source pad structures.

The semiconductor substrate or wafer 10 includes a plurality of commonly processed semiconductor components 15, i.e. not yet finished semiconductor devices. FIG. 1A exemplifies this by indicating several semiconductor components 15 formed in the semiconductor substrate 10. In this embodiment, each semiconductor component 15 includes a metal pad structure 13. Each metal pad structure 13 can include one or more separate metal pads which can be comprised of the same metal or of different metals. Furthermore, the metal pads can be of different height and shape. For example, a metal pad used as source metallisation will typically be larger than a metal pad used as gate metallisation.

According to one or more embodiments, the processes for forming structures of the semiconductor components 15 at the first surface 11 are finished. This typically includes the formation of metal pad structures 13 which are later used as landing pads for bond wire connections.

According to one or more embodiments, the semiconductor components 15 can also be semi-finished. Typically, most of the desired structures including doping regions located at or near the first surface 11 have already been formed.

According to one or more embodiments, a carrier substrate 20 can be bonded or otherwise attached to the first surface 11 of the semiconductor substrate 10. The carrier substrate 20 can be for example a flat or plane glass wafer which can be attached to the semiconductor substrate 10, particularly to the metal pad structure 13, by an adhesive such as an adhesive foil.

Carrier substrate 20 will be detached in a later process and therefore serves only as a temporal support. In this regard, carrier substrate 20 mechanically supports the semiconductor substrate 10 during one or more of the subsequent processes. Furthermore, carrier substrate 20 can also be configured to protect the first surface 11 and the semiconductor components 15 during these processes. Generally, carrier substrate 20 facilitates handling of the semiconductor substrate 10.

Carrier substrate 20 can be bonded or attached to semiconductor substrate 10 after it has already been brought to its final or device thickness, which is also referred to as given thickness. In a typical application, the carrier substrate 20 will be attached to the semiconductor substrate 10 before thinning the semiconductor substrate 10. This will be described in more detail further below. Typically, the final semiconductor substrate 10 can be very thin. For example, semiconductor substrate 10 can have a final or device thickness of about 10 µm. A typical range for the final or device thickness is, depending on the type of the final semiconductor device, between about 1 µm and about 30 µm, without being limited thereto. According to embodiments, the final or device thickness can be in a range from about 1 µm to about 20 µm.

The term "thickness" relates to the vertical thickness in relation to the orientation of the drawings. Furthermore, the term "device thickness", "given thickness" "final thickness" or "given device thickness" as used herein intends to describe the target thickness which the semiconductor substrate has when finished. The semiconductor substrate may have this thickness only in selected regions, particularly in the active region of the semiconductor component. The device thickness may correspond to the smallest distance between the first and the second surface of the semiconductor substrate. The semiconductor substrate may have the final thickness when provided or can be thinned, during manufacturing, from an "initial thickness" greater than the final thickness to the final thickness. Thinning may take place only in selected areas.

FIG. 1A illustrates the situation where the semiconductor substrate 10 having its final or device thickness is attached to carrier substrate 20. Hence, a semiconductor substrate 10 having a first surface 11 and a second surface 12 opposite to the first surface 11 and a carrier substrate 20 are provided, wherein the carrier substrate 20 is attached to the first surface 11 of the semiconductor substrate 10.

Figure 1B:
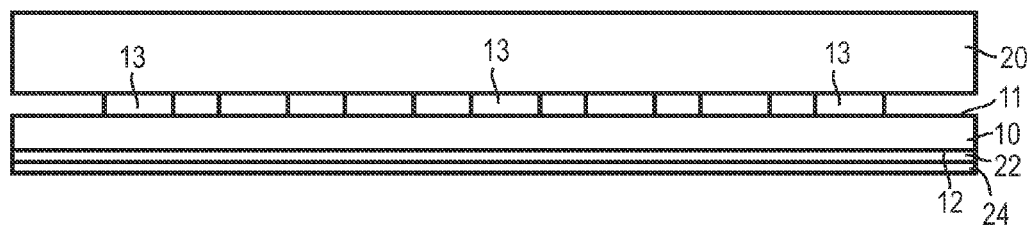

In a further process, as illustrated in FIG. 1B, a thin metal or metal-containing layer 22 is formed on the second surface 12 of the semiconductor substrate 10. The metal or metal-containing layer 22 serves as a contact layer to provide a good ohmic contact to the semiconductor material of the semiconductor substrate 10. Furthermore, metal or metal-containing layer 22 can be configured to provide a barrier against diffusion of copper (Cu) or other metals used to form a thick metallisation layer, which is also referred to as metallisation, as described further below. For example, metal-containing layer, which will be referred to hereinafter as barrier layer 22, can be comprised of Aluminium (Al), Chromium (Cr), Titanium (Ti), Nickel (Ni) or Silver (Ag) or any suitable combination or alloy including at least one of these metals. Barrier layer 22 can be formed for example by physical vapour deposition (PVD).

On barrier layer 22, an optional thin seed layer 24, which can also be referred to as plating start layer, can be formed, for example by PVD. Seed layer 24 provides a surface to facilitate plating of the metal used to form the thick metallisation layer. For example, when plating copper, seed layer 24 can be comprised of copper, silver, or any other suitable metal or metal alloy. Barrier layer 22 serves as seed layer when additional seed layer 24 is omitted.

Barrier layer 22 and seed layer 24 can be made comparably thin. For example, barrier layer 22 can be in the range from about 100 nm to about 1 μm, without being limited thereto. Seed layer 24 can be, for example, in the range from about 150 nm to about 1000 nm, typically in the range from about 150 nm to about 500 nm, without being limited thereto. Typically, the respective thicknesses are selected to ensure that these layers provide their respective desired function.

Figure 1C:
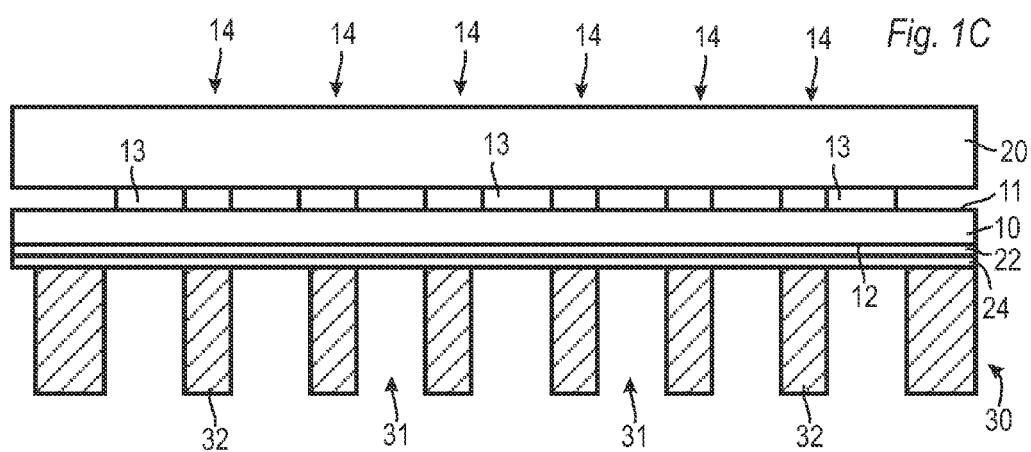

In a further process, a structured mask layer 30 is formed on the seed layer 24, or on barrier layer 22 if seed layer 24 is omitted, as illustrated in FIG. 1C. Mask layer 30 has openings 31 formed in coincidence with the regions where the respective semiconductor components 15 are formed. Openings 31 define the size and shape of metallisation portions to be subsequently formed. In order to provide large contact regions to the semiconductor substrate 10, openings 31 can be sized and shaped, according to embodiments, such that most or all of the surface regions of the final semiconductor devices will be covered by thick metallisation portions.

According to one or more embodiments, mask layer 30 includes structural elements 32 such as bars which are arranged on those regions 14 of the semiconductor substrate 10 along which the semiconductor substrate 10 will be diced in a later process. These regions are often referred to as die street, scribe street or saw street. In the following, these regions will be referred to as die street regions 14. Die street regions 14 run along the periphery of the semiconductor components 15 and along the boundary between adjacent semiconductor components 15. Openings 31 are arranged outside of die street regions 14.

Mask layer 30 is configured to cover the die street regions 14 while leaving the regions between adjacent die street regions 14 uncovered. The lateral extension or width of structural elements 32 of the mask 30 can be adapted to be in the range of the lateral extension or width of the die street regions 14. Typically, the width of a structural element 32 between adjacent openings 31 can be selected to provide for sufficient space for the cutting tool. For example, structural elements 32 can have a lateral width between about 20 μm to about 100 μm. In other embodiments, structural elements 32 have a lateral width between about 60 μm to about 80 μm. In other words, adjacent openings 31 are spaced apart from each other by about the width of structural elements 32. Moreover, the width of elements 32 is selected such to avoid formation of the thick metallisation in the die street regions 14. This facilitates dicing, such as laser cutting or sawing, of the semiconductor substrate 10 as explained below.

Furthermore, mask layer 30 can have a thickness (in vertical direction) sufficient for defining the final thickness of the thick metallisation layer. For example, the thickness of mask layer 30 is chosen such that it slightly exceeds the desired final thickness of the metallisation layer to have a safety margin. For example, when the metallisation layer shall have a final thickness of about 50 μm, the vertical thickness of mask layer 30 is slightly larger than 50 μm. It goes without saying that the thickness of mask layer 30 is not limited to this value.

Mask layer 30 can be comprised of a resist material, which can be photosensitive to allow photolithographic structuring. An example is a negative resist such as THB 151. In another embodiment, mask layer 30 can be comprised of an epoxy material. Typically, mask layer 30 is comprised of a material which allows formation of stable structures which can withstand the environmental conditions occurring during subsequent formation of the thick metallisation.

Mask layer 30 can be formed by different processes. For example, when using a thin fluid resist solution, spin-on coating or spray-coating is often used. When using a higher viscous resist solution or when forming an epoxy mask layer, printing is often more suitable.

In a further process, as illustrated in FIG. 1D, openings 31 can be filled by a metal or a metal-alloy for forming the thick metallisation 40. Typically, a metal will be plated using mask layer 30 as a mask to form a structured metallisation. As plating will take place only on metallic surfaces such as the surface portion of the seed layer 24 exposed by mask layer 30, metallisation 40 will be formed in a self-structured manner. No additional mask or etching is needed for structuring metallisation 40. This is also referred to as pattern plating. Plating typically does not start on insulating surfaces such as the side walls of mask layer 30. Metallisation 40 will therefore be formed on the regions not covered by mask layer 30. Plating can be continued until metallisation has a thickness similar to the thickness of the mask layer 30. Typically, plating will be stopped before the plated metal starts to overgrow mask layer 30. As a result, a plurality of thick metal portions 41 is formed on the second surface 12 of the semiconductor substrate 10, wherein each metal portion 41 form a backside metallisation of a final semiconductor device.

Thick metallisation 40 can have a thickness of about 20 μm to about 100 μm, particularly from about 30 μm to about 50 μm or 60 μm. Typical values are about 50 μm and also up to nearly 100 μm. Metallisation 40 will later form a low ohmic carrier plate for the semiconductor chip of the final semiconductor device. Hence, metallisation 40 will serve as a low ohmic electrical connection of the semiconductor device. Furthermore, metallisation 40 also provides a means for dissipating heat during operation of the semiconductor device. A thick metallisation comprised of copper is particularly suitable for this purpose since copper is both thermally and also electrically very conductive. A sufficiently thick metallisation 40 improves not only heat dissipation to the surrounding but also prevents large temperature differences within the semiconductor device. Moreover, the thick metallisation 40 mechanically stabilizes the semiconductor chip of the semiconductor device before it is finally encapsulated.

The metallisation and metallisation portions, respectively, reinforce the semiconductor substrate or semiconductor chips so that the semiconductor substrate or the chips can be detached from a carrier system without breaking it. Carrier substrate 20 may form such a carrier system. Metallisation portions thus form a high conductive carrier or reinforcing layer, which is permanently attached to the semiconductor substrate and the final semiconductor chips, respectively.

According to one or more embodiments, metallisation 40 and metallisation portions 41 have a thickness which is larger than the final or device thickness of the semiconductor substrate 10. The final thickness of semiconductor substrate 10 can be limited to a range sufficient to accommodate the needed structures. Particularly power devices have a drift region which needs to be sufficiently large to accommodate the depletion zone formed under blocking conditions. However, when forming drift regions which are larger than needed, i.e. devices with thick semiconductor substrates, the resistance during the on-state, the on-state resistance, is increased. It is therefore desired to reduce the thickness of the semiconductor substrate 10 to avoid losses. Desired thickness ranges for the semiconductor substrate include from about 1 μm to about 60 μm without being limited thereto.

In embodiments, the thick metallisation 40 can be for example at least twice as thick as the semiconductor substrate 10 or even larger than that. The actual thickness of the metallisation can be selected depending on circumstances.

FIG. 1E illustrates an enlarged illustration of a section of FIG. 1D. The boundary between seed layer 24 and thick metallisation 40 is indicated here by a dashed line. For example, when thick metallisation 40 is formed by the same metal as seed layer 24, both form together a metallisation structure comprised of a single metal. FIG. 1E also illustrates that the surface of metallisation 40 is recessed from the surface of mask layer 30 by a safety margin to ensure that the metallisation portions 41 remain separated from each other.

Metallisation 40 can be formed, for example by copper plating such as electrodeposition or electroplating. Suitable electrolyte solutions for copper plating are Cu-acid electrolytes and sulphidic electrolytes to name few.

Metallisation 40 can also be formed by other suitable processes such as pasting.

When using copper, metallisation 40 can be easily soldered to a substrate carrier when finalising the semiconductor device. Another suitable material for the metallisation 40 is silver (Ag). Metallisation 40 can also be formed by suitable alloys or by stack structures having two or more layers. The layers can be of different material such as copper and tin or silver and tin to name few. It is, however, also possible to form a soldering layer on the thick metallisation 40. For example, a thin tin (Sn) layer can be formed on a copper metallisation portion. Layered metallisations may have a top layer made of tin. Such structures can be soldered by diffusion soldering.

Figure 1F:
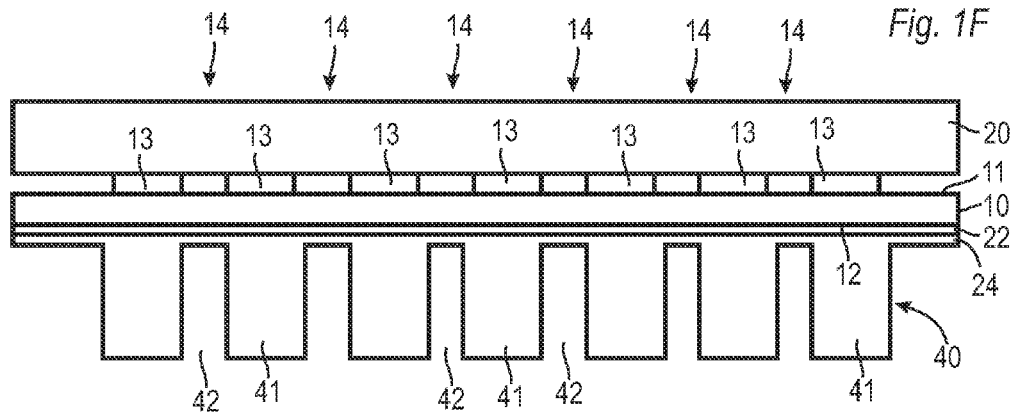

FIG. 1F illustrates a further process. After formation of the metallisation 40, mask layer 30 can be removed. This is, however, only optional and not necessarily required. As a result, a structured metallisation 40 having a plurality of thick metal portion 41 remain on the second surface 12 of the semiconductor substrate 10. Metallisation 40 includes a plurality of channel or trenches 42 arranged between adjacent metallisation portions 41. The location and course of the trenches 42 correspond to the course of the die street regions 14 between adjacent semiconductor components 15. The trenches or channels 42 form separation regions along which the semiconductor substrate will be later diced. When mask layer 30 is not removed, the separation regions are filled with the material of mask layer 30.

Metallisation portions 41 are still electrically connected with each other by thin barrier layer 22 and/or seed layer 24. This connection will be, however, removed during dicing.

Figure 1G:
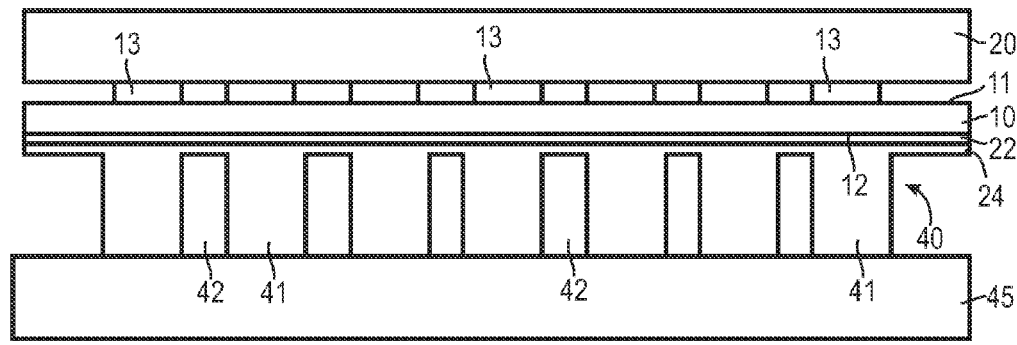

Such prepared substrate 10, as illustrated in FIG. 1F, can be mounted with the metallisation 40 on a saw frame or scribe frame 45 to support the semiconductor substrate 10 during dicing. Saw frame 45 will be typically laminated to metallisation 40. The resulting structure is illustrated in FIG. 1G.

Figure 1H:
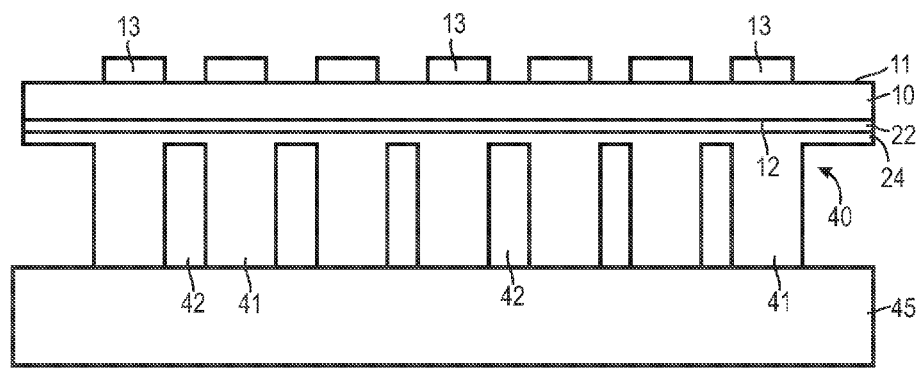

In a further step, as illustrated in FIG. 1H, carrier substrate 20 is detached from the semiconductor substrate 10.

Figure 1I:
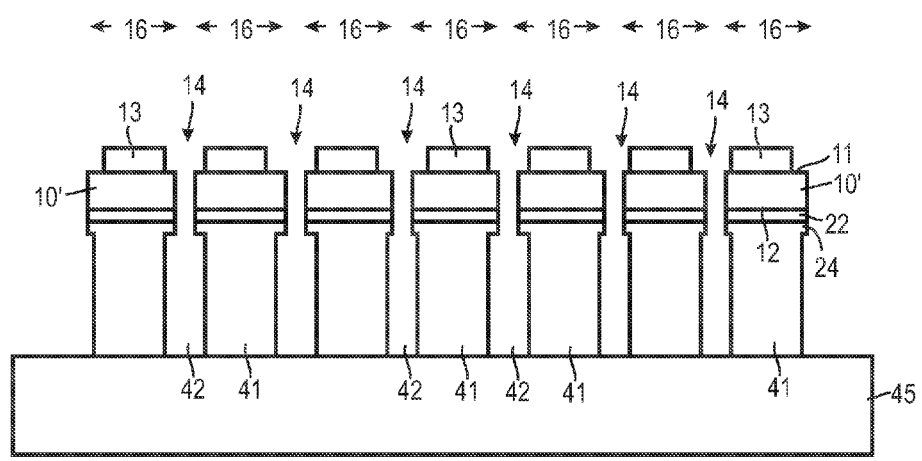

In a further step, as illustrated in FIG. 1I, semiconductor substrate 10 is diced along the die street regions 14 corresponding to the trenches 42 of metallisation 40. Therefore, separation of the semiconductor substrate 10 takes place only through the semiconductor material and not through the thick metallisation 40 which has already been structured in advance during plating. The die street regions 14 are not covered by the thick metallisation.

When mask layer 30 was not removed in a previous process, mask layer 30 will be cut by the separation process so that mask portions may remain on sidewalls of the metallisation portions 41. The separation process may also remove the mask material.

The approach described herein allows formation of die street regions 14 between adjacent semiconductor components 15 which only need to have a lateral thickness sufficient for accommodating the cutting tool. No additional thick margins as usually required for cutting thick metal layers needs to be provided since metallisation portions 41 are separated from each other by a process different than the process for cutting the semiconductor substrate 10. Therefore, suitably adapted cutting processes can be employed which increases the yield.

When separating the electronic components 15 along die street regions 14, the separation occurs through material having similar mechanical properties. FIG. 1I illustrates that the separation takes place though the semiconductor substrate 10 and the thin barrier layer 22 and plating start layer 22. The separation does not run through the thick metallisation portions 41. The semiconductor substrate 10 is a brittle material. Different thereto, the thick metallisation is comprised of a ductile metal having mechanical properties different to that of the semiconductor substrate 10. This difference in mechanical properties would cause difficulties during dicing when both materials are cut by the same process. The present approach avoids such difficulties.

According to one or more embodiments, metallisation 40, also referred to as back metallisation, is structured in advance to have separate thick metallisation portions 41 which are laterally spaced apart from each other. The space or trenches 42 between the separate metallisation portions 41 are used for dicing. Increasing the thickness of the metallisation regions to improve thermal dissipation therefore does not interfere with the separation process. In fact, the die street regions 14 can be kept as small as needed while increasing the thickness of the metallisation 40. Structuring of the metallisation on the second surface 12 of the semiconductor substrate 10 also reduces warping of the semiconductor substrate 10. As the separation does not cut through the thick metallisation, the separation tools such as saws are also not loaded with metal during separation which improves the separation process.

For illustration purposes, die street regions 14 can have a width of about 30 μm for dicing semiconductor substrate 10. This size roughly corresponds to the width of a sawing tool. When separating a copper layer having a thickness of 50 μm or more by a sawing tool, a "separation region" of at least 200 μm would be needed due to the ductile properties of copper. Hence, when dicing a semiconductor substrate together with such a thick copper layer, the die street regions must be in the range of at least 200 μm. The approach using a pre-structuring of a thick back metallisation as described herein avoids such large die street regions and can therefore minimise waste of material.

As the metallisation 40 has already been structured in advance during plating or pasting, separation or dicing can also take place by breaking. For dicing, any suitable dicing process can be used such as scribe-and-break, laser cutting and sawing. The optional thin metallic layers 22, 24 do not significantly interfere with the above described dicing processes.

As a result of the dicing process, separate semiconductor devices 16 are formed each having a semiconductor chip 10' as illustrated in FIG. 1I. When detaching the semiconductor chips 10' from the saw frame, the thick metal portions 41 reduces deformation of the semiconductor chip and thus mechanical stress. Breakage of the chips 10' can be avoided. Thick metal portions 41 therefore also serve as "handling substrate" for the delicate and thin semiconductor chips 10'.

Figure 1J:
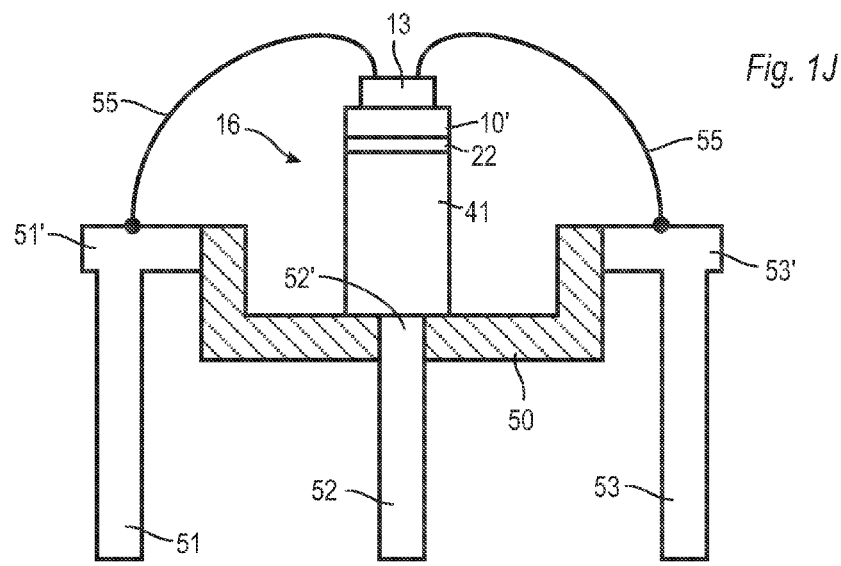

In a further process, the semiconductor devices 16 are soldered with their metallisation portions 41 to respective substrate carriers 50 as illustrated in FIG. 1J. Substrate carriers 50 are made of an insulating material and include lead structures 51, 52, 53. Lead structures 51 and 53 include bonding pads 51' and 53' arranged on an upper side of the carrier substrate 50 while lead structure 52 includes a pad 52' to which the semiconductor device is attached with its metallisation portion 41 formed on the second surface 12 of the semiconductor chip 10'. Electrical connection between metal pad 13 and bonding pads 51' and 53', respectively, are provided by bond wires 55.

Figure 1K:
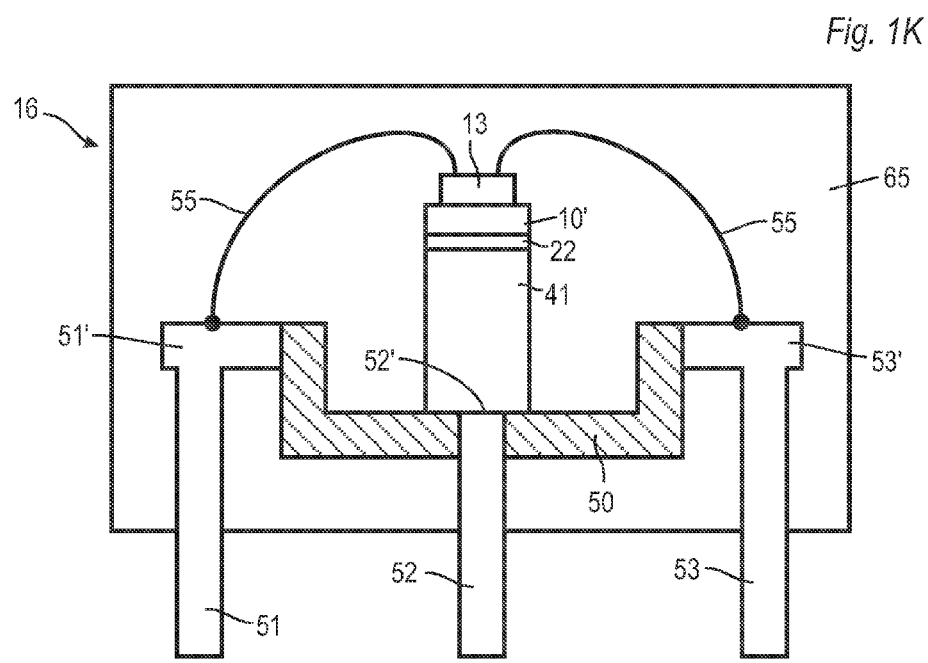

Finally, the semiconductor device can be encapsulated in a suitable insulating material 65 such as an epoxy resin to form a semiconductor module as illustrated in FIG. 1K.

As described above, forming spaced apart metallisation portions 41 on the second surface 12 of the semiconductor substrate 10 reinforces the semiconductor substrate 10 and also the final chips 10'. Typically, each chip 10' includes at least one thick metallisation portion 41 formed on its second or back surface. Metallisation portions 41 also serve for heat dissipation and an electrical contact to the device. Semiconductor devices or integrated circuits which do not have or which do not need an electrical contact on the second surface can also benefit from a thick metallisation portion 41, which will then serve as reinforcing layer and for heat dissipation.

Furthermore, low-cost substrate carriers 50 can be used since the devices already include a highly conductive substrate formed by the metallisation portion.

The improved thermal dissipation also improves the robustness and ruggedness of the devices, particularly under avalanche conditions and breakdown. In these situations, the devices produce large lost-heat which is easily dissipated by the thick metal portion. Thermal failure can be avoided and the life-time of the devices extended.

Furthermore, metal portions comprised of copper, silver, tin, metal alloy or metal layer stack can be easily soldered to commonly used substrate carriers by the "solder die attach" or by diffusion soldering.

The semiconductor devices manufactured as described herein have a low-ohmic carrier which is mechanically stable, reinforces the device, compatible with commonly used processes and provides for reliability of the final device. This allows a further reduction of the final device thickness which reduces on-state losses and improves thermal dissipation.

FIG. 2 illustrates an enlarged view of a final semiconductor device according to a further embodiment. The semiconductor device is soldered to a carrier substrate 50 having lead structures 51, 52, 53 and pads 51', 52' and 53', respectively. The semiconductor device is in the present embodiment a three-terminal device and includes a metal pad 13' forming a gate electrode and a metal pad 13 forming a source electrode. The gate electrode is insulated from the semiconductor material of chip 10' by a gate dielectric layer 60. Doping regions are also illustrated. Reference numeral 61 denotes a source region while reference numeral 62 denotes a body region doped opposite to source region 61 and the semiconductor material of the chip 10'. A drain region 63 is formed at the second surface of the chip 10'. A drift region 64 is formed between drain region 63 and body region 62. Drain region 63 is electrically connected to pad 52' through metal portion 41 forming here the back-side metallisation while source region 61 is electrically connected to metal pad 53' through bonding wire 55. Gate electrode is electrically connected to metal pad 51' through metal pad 13' and another bond wire 55.

The description is not limited to three-terminal devices such as FETs, illustrated in FIG. 2, or IGBTs but also encompasses two-terminal devices such as diodes or four or multi-terminal devices and integrated circuits.

Figure 3A:
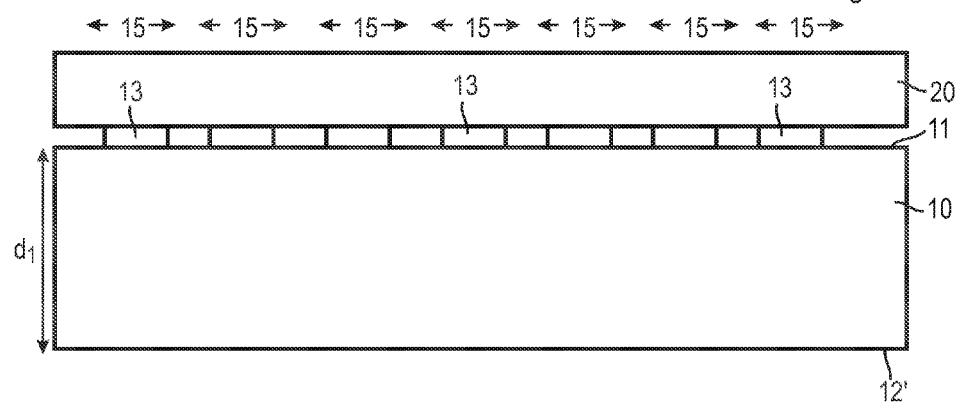
FIGS. 3A to 3C illustrate processes of a method for manufacturing semiconductor devices according to one embodiment.
Figure 3B:
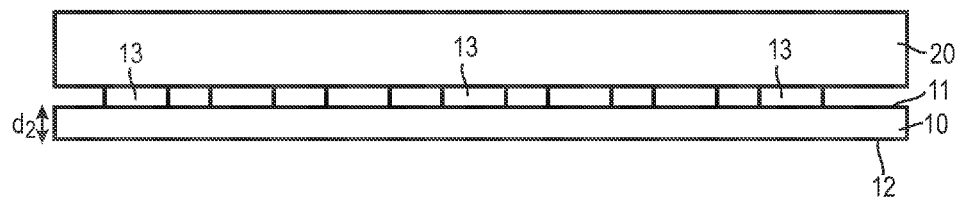
Figure 3C:
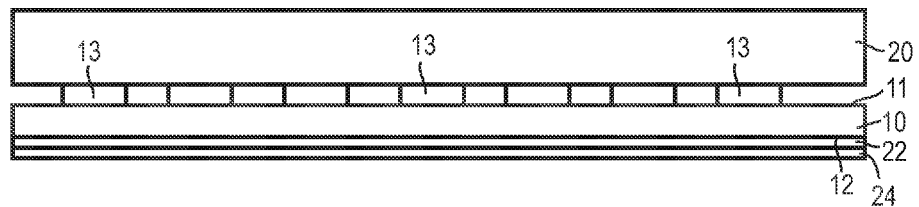

With respect to FIGS. 3A to 3C, a further embodiment is described. A semiconductor substrate 10 having a first surface 11 and a second surface 12' arranged opposite to the first surface 11 is provided. The semiconductor substrate 10 includes a plurality or semiconductor components 15 as described above. Semiconductor components 15 can include doping regions, for example formed on or at the first surface 11 and metal pad structures 13. The semiconductor substrate 10 has an initial thickness $d_1$ which is larger than the final or device thickness $d_2$. A carrier substrate 20 can be bonded or otherwise attached to the first surface 11 of the semiconductor substrate 10 as described above.

In a further process, as illustrated in FIG. 3B, the second surface 12' of the semiconductor substrate 10 is machined to reduce its thickness. Machining can include any suitable process for reduce the thickness of a semiconductor material or wafer. Examples are mechanical grinding, chemical-mechanical polishing, lapping and etching. Machining the second surface 12' of the semiconductor substrate 10 reduces the initial thickness $d_1$ of the semiconductor wafer 10 to a target thickness $d_2$ which is less than the initial thickness. Target thickness $d_2$ can be in the range given above. Machining the second surface 12' of the semiconductor substrate 10 produces a machined second surface 12 as illustrated in FIG. 3B.

In further processes, as illustrated in FIG. 3C, a barrier layer 22 and a seed layer 24 are formed as described above. Further subsequent processes can follow as described in connection with FIGS. 1C to 1K.

Figure 4A:
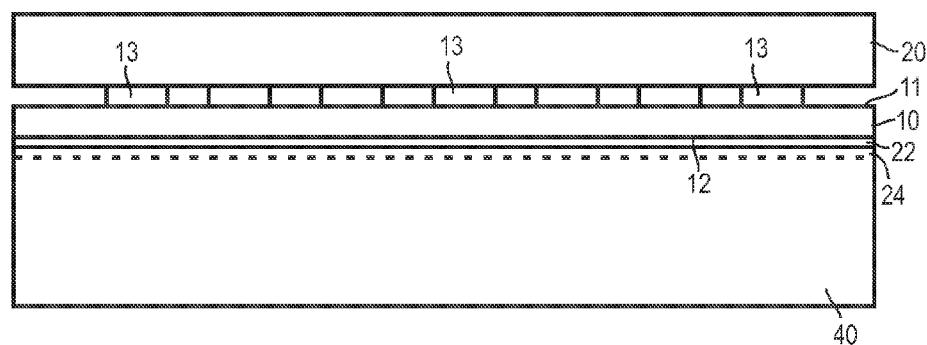
FIGS. 4A to 4B illustrate processes of a method for manufacturing semiconductor devices according to one embodiment.
Figure 4B:
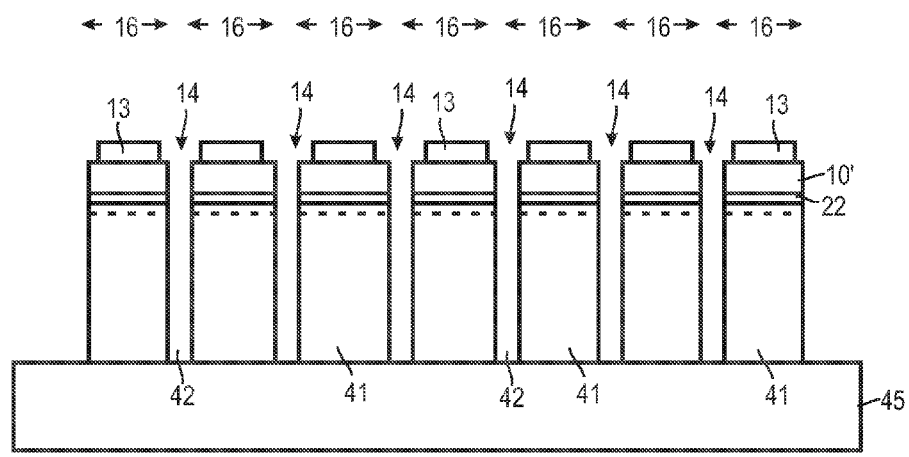

FIGS. 4A to 4B illustrate a variation of the manufacturing method according to one or more embodiments. Different to the embodiment illustrated in FIGS. 1A to 1K, no mask layer 30 is formed before forming metallisation layer 40. Hence, metallisation layer 40 is not self-structured when deposited.

Metallisation layer 40 has a thickness greater then the thickness of the semiconductor substrate 10. Therefore, when dicing the semiconductor substrate 10 together with metallisation layer 40, semiconductor devices 16 are formed each having a thick metal portion 41 on the second surface of the chip 10'.

This variation may produce wider trenches 42 between adjacent metallisation portions 41, however, can be used if space-limitation is not critical. Furthermore, this variation includes fewer manufacturing processes than the embodiments described above.

Figure 5A:
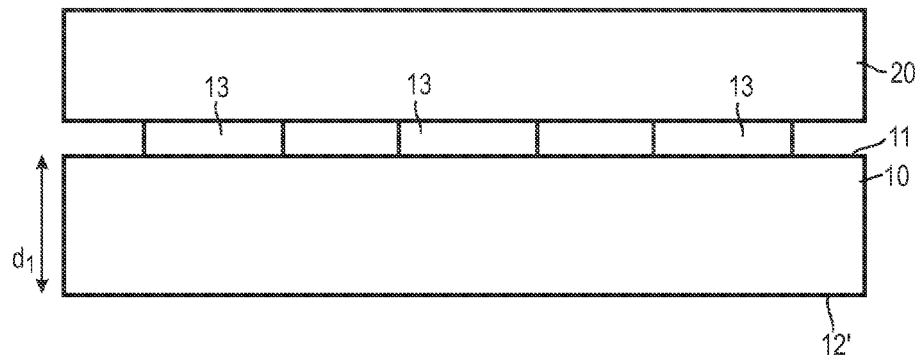
FIGS. 5A to 5C illustrate processes of a method for manufacturing semiconductor devices according to one embodiment.
Figure 5B:
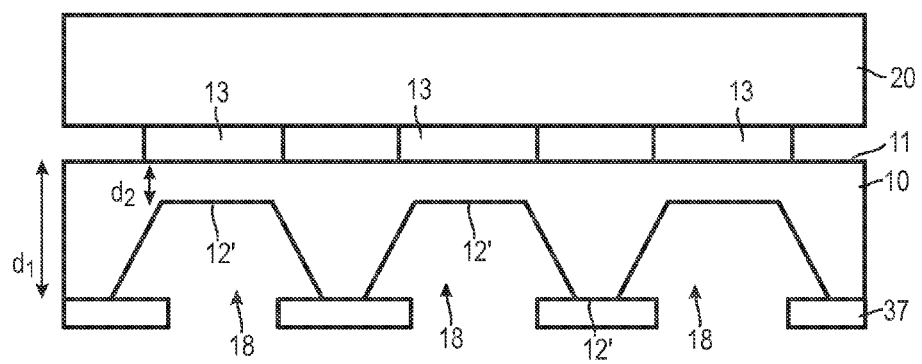
Figure 5C:
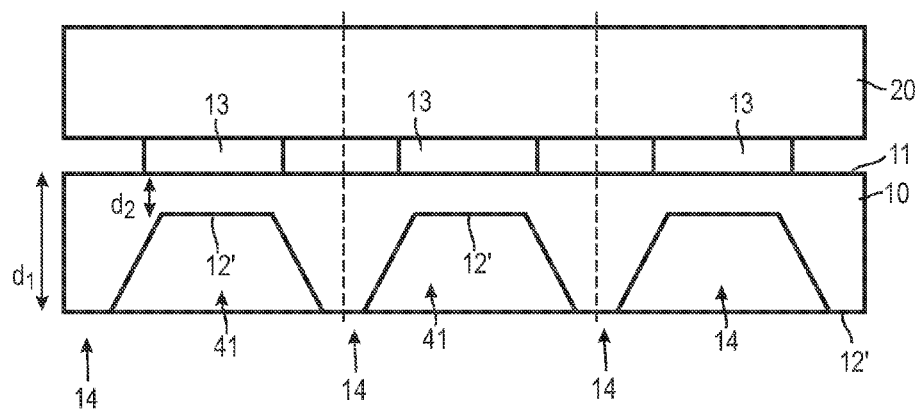

In connection with FIGS. 5A to 5C, a further variation of the manufacturing method according to one or more embodiments will be described. The semiconductor substrate 10 has an initial thickness $d_1$. An etching mask 37 is formed on the second surface 12' defining regions where the semiconductor substrate 10 is subsequently thinned. The semiconductor substrate 10 is then etched, for example by wet-chemical etching using an alkali etching solution. A suitable etching solution is KOH. Wet-chemical etching can be anisotropic, i.e. exhibit different etch rates in different crystal orientations. This may lead to the formation of inverse pyramidal structures on the second surface 12' as illustrated in FIG. 5B. The pyramidal structures form recesses 18 in the semiconductor substrate 10. Anisotropic etching may also lead to a certain under-etching of etching mask 37.

Selective etching of the second surface 12' results in a thickness reduction in selected regions. These regions typically correspond to the active regions of the respective semiconductor components. The semiconductor substrate 10 will then have the final or device thickness $d_2$ in the active regions while be thicker in other regions.

After removing the etching mask 37, copper or any other suitable metal is deposited in the recesses 18 to form spaced-apart metallisation portions 41. The semiconductor substrate 10 is subsequently diced along the dashed line. Separation occurs only through the semiconductor material since the die street regions 14 remain metal free during metal deposition.

In connection with FIGS. 6A to 6E, a further variation of the manufacturing method according to one or more embodiments will be described. Semiconductor substrate 10 has an initial thickness $d_1$ and includes a pn-junction 17 disposed from the first surface 11 by a distance which roughly corresponds to the final thickness $d_2$. The semiconductor substrate 10 is also thinned by etching, for example by KOH. PN junction 17 serves as etch stop.

Figure 6A:
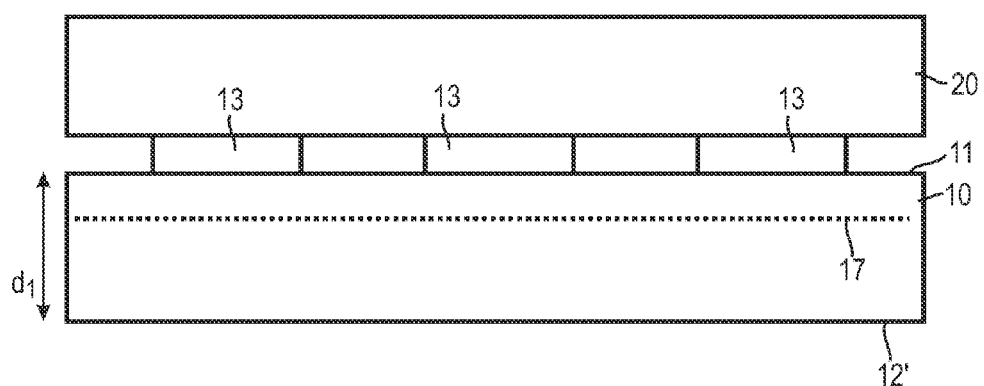
FIGS. 6A to 6E illustrate processes of a method for manufacturing semiconductor devices according to one embodiment.
Figure 6B:
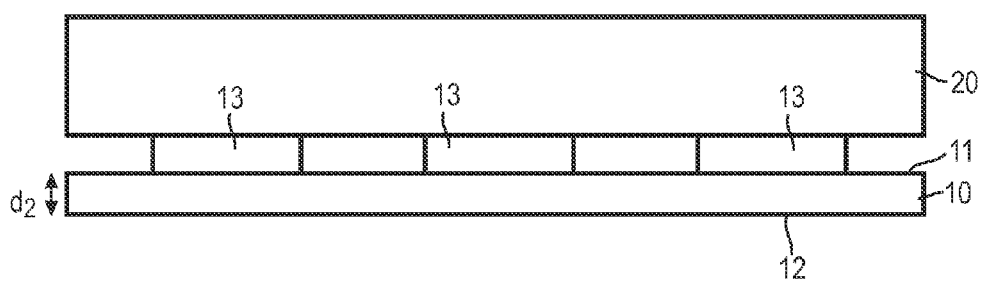
Figure 6C:
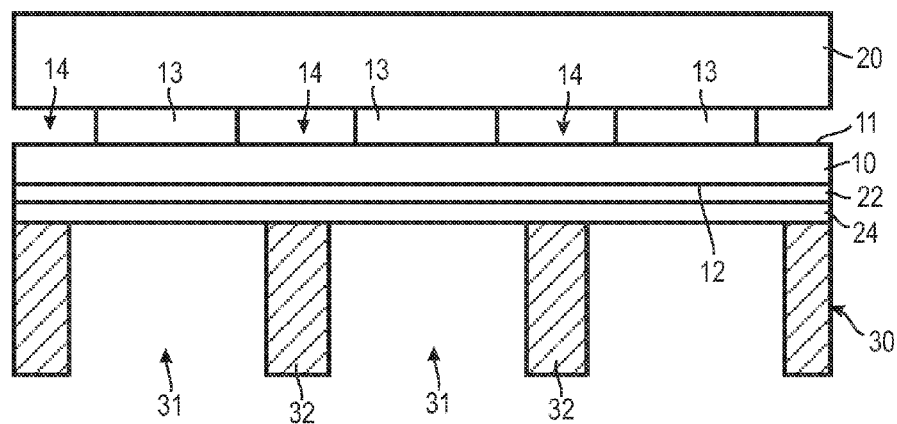
Figure 6D:
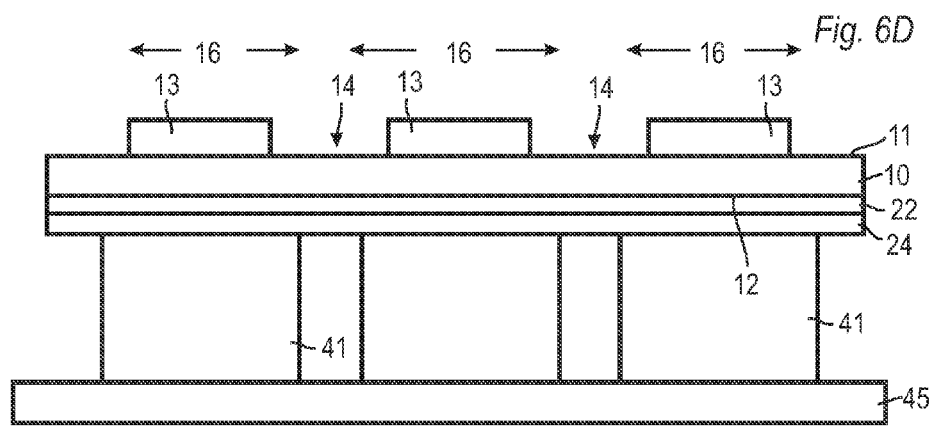
Figure 6E:
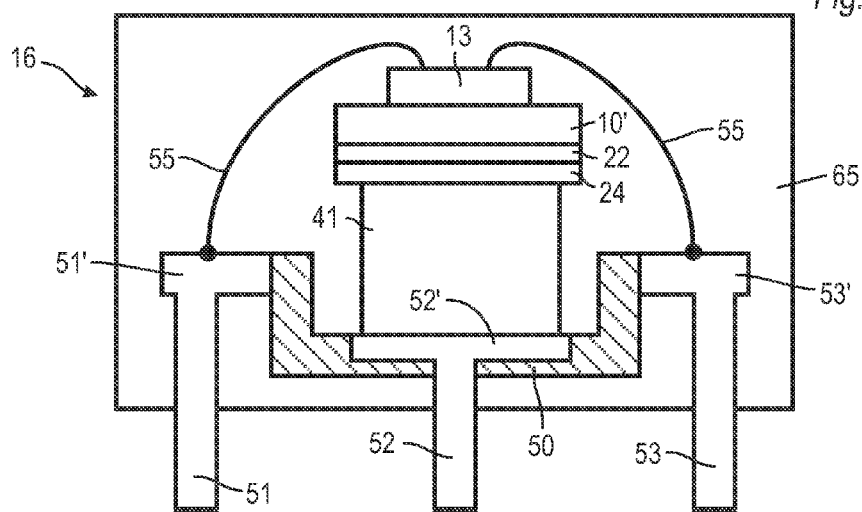

After having the semiconductor substrate etched down to about the final thickness $d_2$, a barrier layer 22 and/or a seed layer 24 can be formed. A mask layer 30 is then formed to define the location of the metal portions 41 as illustrated in FIG. 6C. Subsequently, metal portions 41 having a thickness greater than the final thickness $d_2$ are formed in the openings 31 of mask layer 30 as described above. Finally, the semiconductor substrate 10 is diced and the thus separated semiconductor devices 16 soldered to a substrate carrier as illustrated in FIG. 6E.

In connection with FIGS. 7A to 7E, a further variation of the manufacturing method according to one or more embodiments will be described. An etching mask 35 is formed on the second surface 12' of a semiconductor substrate 10 having an initial thickness $d_2$. The etching mask 35 covers the die street regions 14. The semiconductor substrate 10 is etched using for example plasma-etching. Another option is wet-chemical etching using an etch solution different than a KOH solution as described above.

Figure 7A:
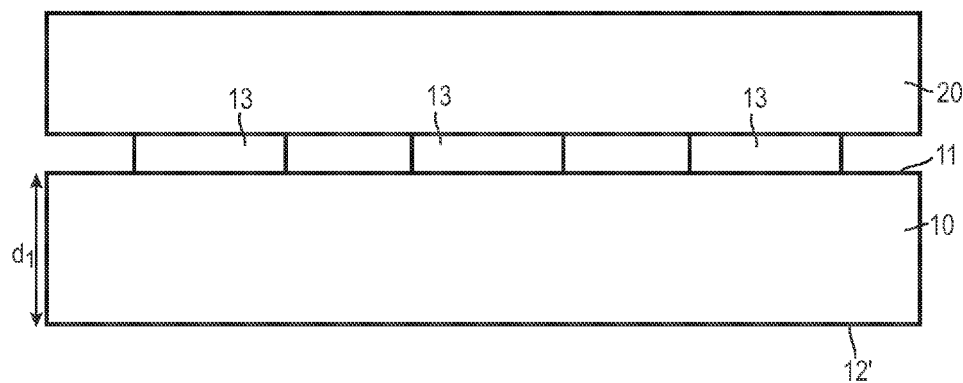
FIGS. 7A to 7E illustrate processes of a method for manufacturing semiconductor devices according to one embodiment.
Figure 7B:
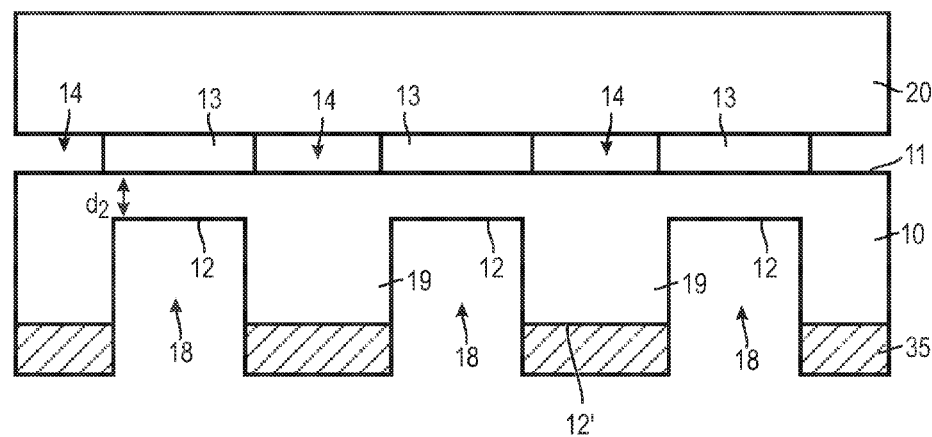

Etching reduces the thickness of the semiconductor substrate 10 from the initial thickness $d_1$ to the final or the device thickness $d_1$ in regions uncovered by etching mask 35. Etch time can be controlled to ensure that the etching is terminated when the desired depth has been reached. The resulting structure is illustrated in FIG. 7B. The semiconductor substrate 10 now has a plurality of recesses 18 which reach to a recessed surface portion forming the second surface 12 of the final device.

Figure 7C:
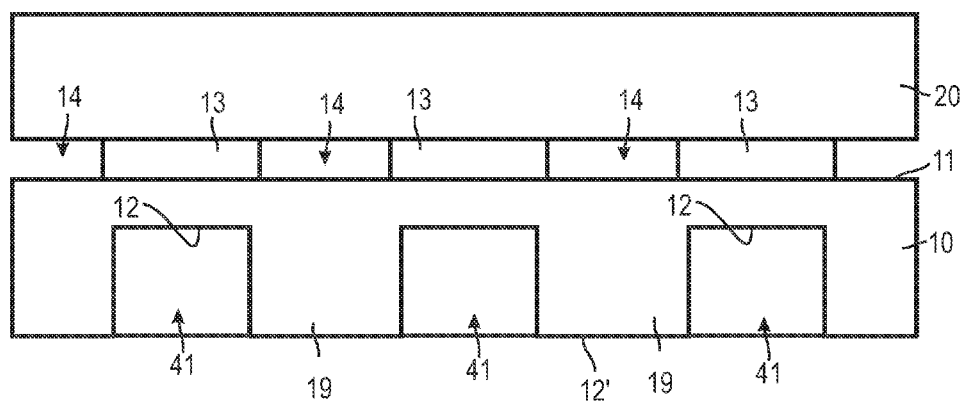
Figure 7D:
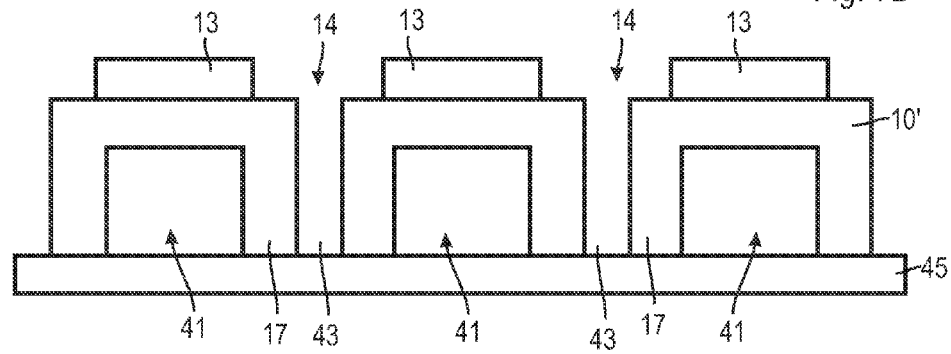
Figure 7E:
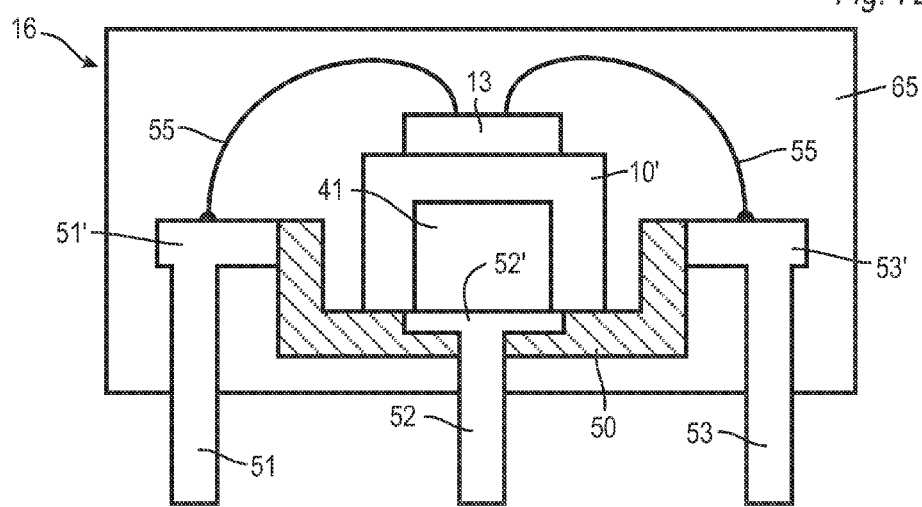

As illustrated in FIGS. 7C and 7D, recesses 18 are filled by a metal such as copper to form metal portions 41 which are spaced-apart by the remaining wall portions 19 between adjacent recesses 18. The semiconductor substrate 10 is then temporarily attached to the saw frame 45 and then cut to obtain separate semiconductor devices 16. After detaching the semiconductor chips 10' from the saw frame 45, the chips 10' are soldered to substrate carrier 50 as described above. The final structure is illustrated in FIG. 7E.

In connection with FIGS. 8A to 8E, a further variation of the manufacturing method according to one or more embodiments is described. A carrier wafer 70 is provided which has a plurality openings 71 formed therein. Carrier wafer can be a glass wafer or any other wafer made of a suitable material. Openings 71 can be formed by any suitable process such as etching or drilling. Carrier wafer 70 is then bonded with its bonding surface 72 to the second surface 12 of a semiconductor substrate 10 having the final thickness. Semiconductor substrate 10 can be thinned prior to bonding as described further above. Furthermore, a barrier layer and a seed layer, which are not illustrated here, can be optionally formed.

Figure 8A:
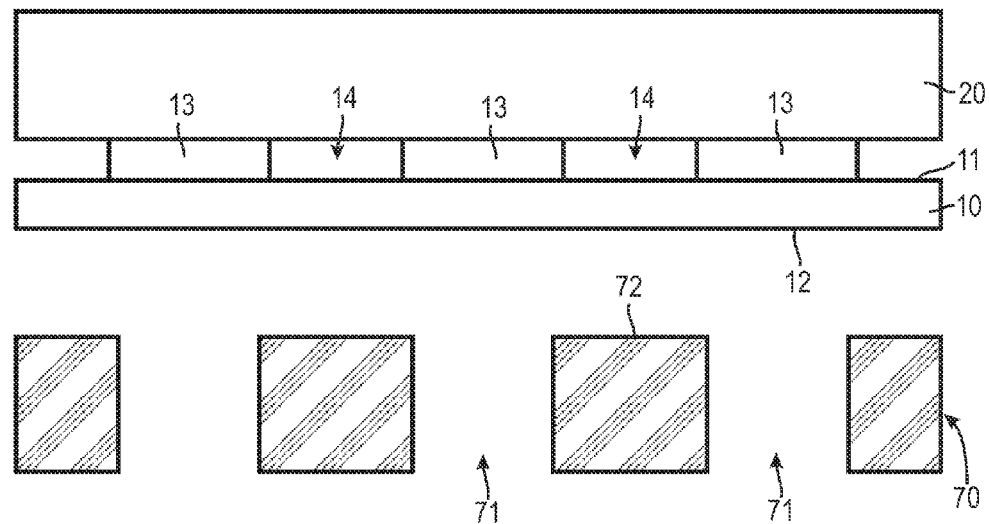
FIGS. 8A to 8E illustrate processes of a method for manufacturing semiconductor devices according to one embodiment.
Figure 8B:
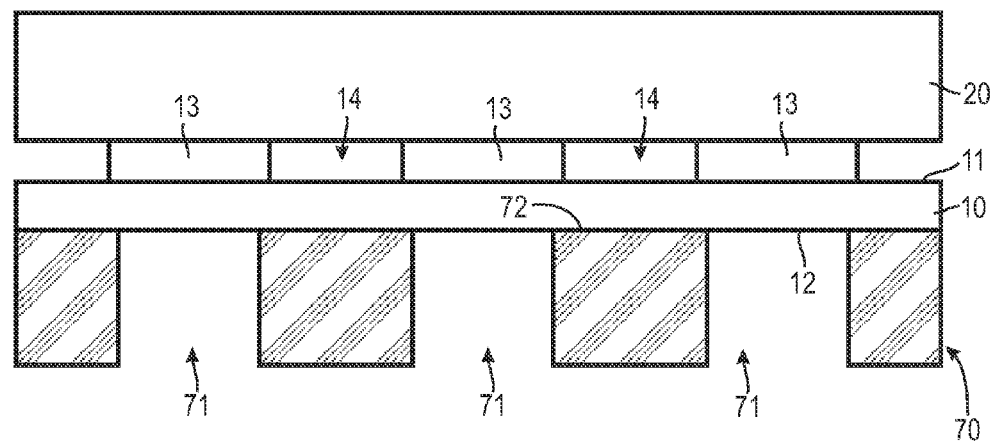
Figure 8C:
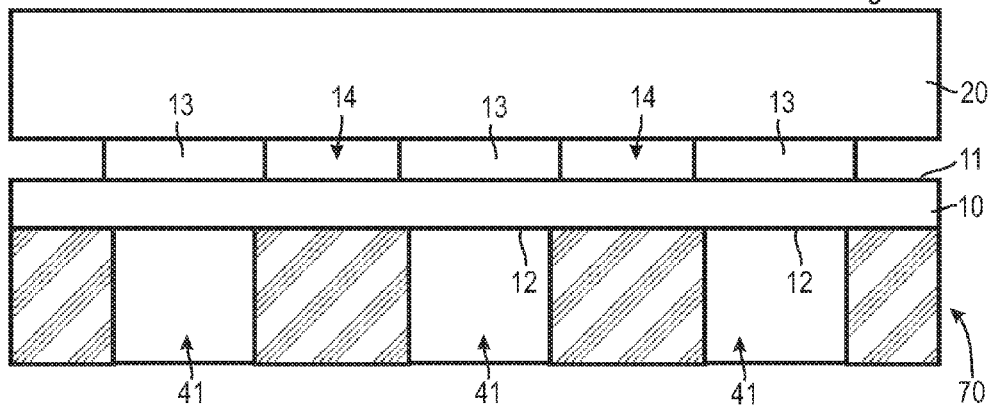
Figure 8D:
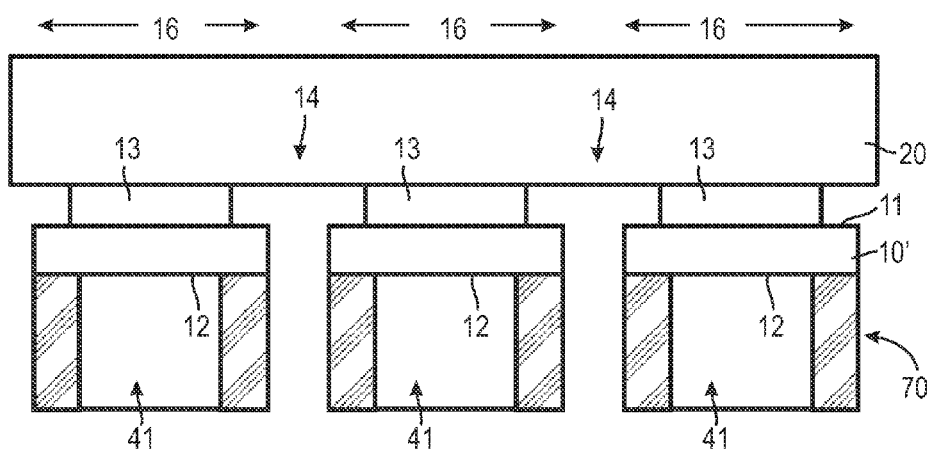

The resulting structure is illustrated in FIG. 8B which shows the openings 71 aligned with the regions of the respective semiconductor components. Die or saw street regions 14 are covered by structural elements of the carrier wafer 70.

The openings 71 of the carrier wafer 70 define the regions where subsequently the metallisation portions are formed. Metallisation portions 41 can be formed as described above, for example by electroplating or pasting.

In a further process, the semiconductor substrate 10 is cut together with the carrier wafer 70 along the die street regions 14. Again, the separation runs through the material of the semiconductor substrate 10 but not through the thick metal portions 41 which were pre-structured during deposition. Dicing can be improved when carrier wafer 70 has similar mechanical properties as the semiconductor substrate 10. A carrier wafer made of glass is such a suitable material.

Figure 8E:
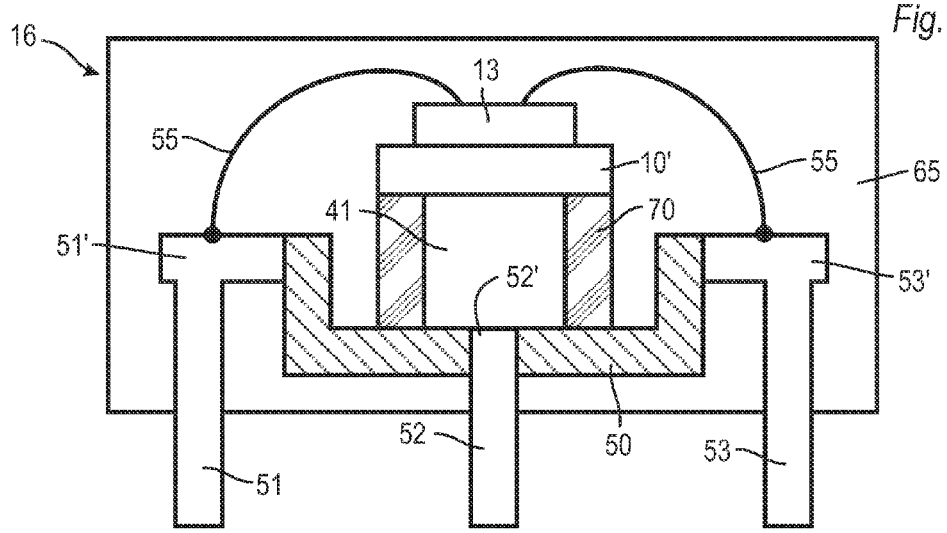

Finally, the separated semiconductor devices are soldered to a substrate carrier 50 and encapsulated as described above. The final structure is illustrated in FIG. 8E.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor chip comprising a first surface and a second surface opposite to the first surface, the semiconductor chip comprising a thickness, and the semiconductor chip comprising a semiconductor component comprising at least one doping region; and at least one metallisation portion on the second surface of the semiconductor chip, the metallisation portion comprising a thickness greater than the thickness of the semiconductor chip;

at least one metal pad on the first surface of the semiconductor chip in electrical communication with the at least one doping region of the semiconductor component;

a substrate carrier comprising at least a first lead structure soldered to the metallization portion and at least a second lead structure comprising a bonding pad arranged on an upper side of the carrier substrate; and at least one bond wire electrically connecting the metal pad arranged on the first surface of the semiconductor chip with the bonding pad arranged on an upper side of the carrier substrate.

2. The semiconductor device of claim 1, wherein the thickness of the semiconductor chip is in a range from about 1 μm to about 60 μm.

3. The semiconductor device of claim 1, wherein the thickness of the metallisation portion is in a range from about 20 μm to about 100 μm.

* * * * *